(12) United States Patent
Cheng et al.

(10) Patent No.: US 10,672,888 B2
(45) Date of Patent: Jun. 2, 2020

(54) VERTICAL TRANSISTORS HAVING IMPROVED GATE LENGTH CONTROL

(71) Applicant: International Business Machines Corporation, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 41 days.

(21) Appl. No.: 15/681,933

(22) Filed: Aug. 21, 2017

(65) Prior Publication Data

US 2019/0058046 A1    Feb. 21, 2019

(51) Int. Cl.
*H01L 29/66*        (2006.01)
*H01L 29/423*       (2006.01)
(Continued)

(52) U.S. Cl.
CPC .... *H01L 29/66666* (2013.01); *H01L 27/2454* (2013.01); *H01L 29/42376* (2013.01);
(Continued)

(58) Field of Classification Search
CPC ........... H01L 29/66666; H01L 27/2454; H01L 29/7827; H01L 29/78642; H01L 29/7856;
(Continued)

(56) References Cited

U.S. PATENT DOCUMENTS 4,791,462 A    12/1988  Blanchard et al.
5,432,114 A     7/1995  O
(Continued)

FOREIGN PATENT DOCUMENTS

WO    2015047281 A1    4/2015
WO    2017103752 A1    6/2017

OTHER PUBLICATIONS

Oxford Dictionaries, "substantially", Oxford Dictionaries, Apr. 2010, http://oxforddictionaries.com/definition/english/substantially.*
(Continued)

*Primary Examiner* — Allen L Parker
*Assistant Examiner* — Wasiul Haider
(74) *Attorney, Agent, or Firm* — Cantor Colburn LLP; Vazken Alexanian (57) ABSTRACT

Embodiments of the invention form a channel fin across from a major surface of a substrate, wherein a top surface of the channel fin extends substantially horizontally with respect to the major surface. A gate is formed across from the major surface and along a sidewall surface of the channel fin, wherein a first top surface of the gate is above the top surface of the channel fin and extends substantially horizontally with respect to the major surface. A second top surface of the gate is defined by a trench formed through an exposed sidewall portion of the gate in a direction that is substantially horizontal with respect to the major surface, wherein a gate length dimension of the initial gate is defined by a distance from a bottom surface of the gate to the second top surface of the gate.

1 Claim, 9 Drawing Sheets

(51) Int. Cl.
*H01L 29/786* (2006.01)
*H01L 29/78* (2006.01)
*H01L 27/24* (2006.01)

(52) U.S. Cl.
CPC .. *H01L 29/42384* (2013.01); *H01L 29/42392* (2013.01); *H01L 29/66553* (2013.01); *H01L 29/66742* (2013.01); *H01L 29/7827* (2013.01); *H01L 29/78642* (2013.01)

(58) Field of Classification Search
CPC ....... H01L 21/823456; H01L 21/82385; H01L 29/42376; H01L 29/42384
See application file for complete search history.

(56) References Cited

U.S. PATENT DOCUMENTS

| | | |
|---|---|---|
| 5,627,393 A | 5/1997 | Hsu |
| 6,087,692 A | 7/2000 | Gobel et al. |
| 6,156,611 A | 12/2000 | Lan et al. |
| 6,187,094 B1 | 2/2001 | Mitsuhata et al. |
| 6,632,712 B1 | 10/2003 | Ang et al. |
| 6,638,823 B2 | 10/2003 | Cho et al. |
| 6,660,590 B2 * | 12/2003 | Yoo .................. H01L 29/66666 257/E21.41 |
| 6,705,516 B1 | 3/2004 | Kubota |
| 6,770,534 B2 | 8/2004 | Cho et al. |
| 6,787,402 B1 | 9/2004 | Yu |
| 6,846,709 B1 | 1/2005 | Lojek |
| 6,949,421 B1 | 9/2005 | Padmanabhan et al. |
| 7,221,032 B2 | 5/2007 | Kondo |
| 7,247,905 B2 | 7/2007 | Cheng et al. |
| 7,294,879 B2 | 11/2007 | Chen et al. |
| 7,372,091 B2 | 5/2008 | Leslie |
| 7,446,025 B2 | 11/2008 | Cohen et al. |
| 7,456,476 B2 | 11/2008 | Hareland et al. |
| 7,683,428 B2 | 3/2010 | Chidambarrao et al. |
| 7,829,447 B2 | 11/2010 | Leo et al. |
| 7,964,893 B2 | 6/2011 | Lee |
| 8,080,458 B2 | 12/2011 | Masuoka et al. |
| 8,362,572 B2 | 1/2013 | Huang et al. |
| 8,653,584 B2 | 2/2014 | Renn |
| 9,087,897 B1 | 7/2015 | Anderson et al. |
| 9,287,362 B1 | 3/2016 | Basu et al. |
| 9,299,835 B1 | 3/2016 | Anderson et al. |
| 9,431,305 B1 | 8/2016 | Anderson et al. |
| 9,570,356 B1 * | 2/2017 | Balakrishnan ............................... H01L 21/823487 |
| 9,653,465 B1 | 5/2017 | Balakrishnan et al. |
| 9,711,618 B1 | 7/2017 | Cheng et al. |
| 9,735,246 B1 | 8/2017 | Basker et al. |
| 9,741,716 B1 * | 8/2017 | Cheng .................. H01L 27/0886 |
| 2004/0219725 A1 | 11/2004 | Furukawa et al. |
| 2005/0190590 A1 | 9/2005 | Chen et al. |
| 2006/0138398 A1 | 6/2006 | Shimamune et al. |
| 2008/0121948 A1 | 5/2008 | Kim et al. |
| 2008/0157225 A1 | 7/2008 | Datta et al. |
| 2009/0057780 A1 | 3/2009 | Wong et al. |
| 2009/0321820 A1 | 12/2009 | Yamakawa |
| 2010/0181614 A1 | 7/2010 | Nojima |
| 2010/0200914 A1 | 8/2010 | Hamada |
| 2011/0042748 A1 | 2/2011 | Anderson et al. |
| 2011/0233512 A1 | 9/2011 | Yang et al. |
| 2011/0254086 A1 | 10/2011 | Hsieh |
| 2011/0260259 A1 | 10/2011 | Masuoka et al. |
| 2011/0303985 A1 | 12/2011 | Masuoka et al. |
| 2012/0025874 A1 | 2/2012 | Saikaku et al. |
| 2012/0319201 A1 * | 12/2012 | Sun .................. H01L 21/823487 257/338 |
| 2014/0166981 A1 | 6/2014 | Doyle et al. |
| 2015/0061013 A1 | 3/2015 | Basu et al. |
| 2015/0187867 A1 | 7/2015 | Basker et al. |
| 2015/0206970 A1 | 7/2015 | Lin et al. |
| 2015/0236094 A1 | 8/2015 | Hsiao et al. |
| 2016/0172488 A1 | 6/2016 | Oh et al. |
| 2017/0178970 A1 | 6/2017 | Anderson et al. |
| 2017/0194318 A1 * | 7/2017 | Balakrishnan ...... H01L 27/0629 |
| 2018/0090598 A1 * | 3/2018 | Xie ................... H01L 29/66666 |
| 2018/0350695 A1 * | 12/2018 | Cheng ............ H01L 21/823487 |

OTHER PUBLICATIONS

Cheng et al., "Gate Length Controlled Vertical FETs," U.S. Appl. No. 15/206,939, filed Jul. 11, 2016.
Cheng et al., "Vertical Transistor With Variable Gate Length," U.S. Appl. No. 15/196,774, filed Jun. 29, 2016.
List of IBM Patents or Patent Applications Treated As Related; Date Filed: Aug. 21, 2017, 2 pages.
Cheng et al., "Vertical Transistors Having Improved Gate Length Control", U.S. Appl. No. 15/803,935, filed Nov. 6, 2017.
E. Chen, "III. Wet and Dry Etching", Apr. 12, 2004, pp. 1-18.
J. M. Hergenrother et al., "The vertical replacement-gate (VRG) MOSFET: A 50-nm vertical MOSFET with lithography-independent gate length," International Electron Devices Meeting, 1999, 4 pages.
Larrieu et al., "Vertical nanowire array-based field effect transistors for ultimate scaling," Nanoscale 5.6 (2013): 2437-2441.

* cited by examiner

VERTICAL TRANSISTORS HAVING IMPROVED GATE LENGTH CONTROL

BACKGROUND

The present invention relates in general to semiconductor devices and their fabrication. More specifically, the present invention relates to improved fabrication methodologies and resulting structures for vertical field effect transistors (VFETs) having improved gate length control based at least in part on a reduced reliance on timed gate recess operations to define the gate length dimension.

Semiconductor devices are typically formed using active regions of a wafer. In an integrated circuit (IC) having a plurality of metal oxide semiconductor field effect transistors (MOSFETs), each MOSFET has a source and a drain that are formed in an active region of a semiconductor layer by implanting n-type or p-type impurities in the layer of semiconductor material. A conventional geometry for MOSTFETs is known as a planar device geometry in which the various parts of the MOSFET device are laid down as planes or layers.

One type of MOSFET is a non-planar FET known generally as a VFET. VFETs employ semiconductor fins and side-gates that can be contacted outside the active region, resulting in increased device density and some increased performance over lateral devices. In VFETs the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. An important parameter in VFET designs is the gate length.

SUMMARY

Embodiments of the invention are directed to methods of forming semiconductor devices. A non-limiting example method includes forming a channel fin structure across from a major surface of a substrate, wherein a top surface of the channel fin structure extends in a direction that is substantially horizontal with respect to the major surface of the substrate. A gate structure is formed across from the major surface of the substrate and along a sidewall surface of the channel fin structure, wherein a first top surface of the gate structure is above the top surface of the channel fin structure and extends in a direction that is substantially horizontal with respect to the major surface of the substrate. An exposed sidewall portion of the gate structure is removed in a direction that is substantially horizontal with respect to the major surface of the substrate to define a second top surface of the gate structure, wherein a gate length dimension of the initial gate structure is defined by a distance from a bottom surface of the gate structure to the second top surface of the gate structure.

Embodiments of the invention are directed to methods of forming semiconductor devices. A non-limiting example method includes forming a channel fin structure across from a major surface of a substrate, wherein a top surface of the channel fin structure extends in a direction that is substantially horizontal with respect to the major surface of the substrate. A gate structure is formed across from the major surface of the substrate and along a sidewall surface of the channel fin structure, wherein a first top surface of the gate structure is above the top surface of the channel fin structure and extends in a direction that is substantially horizontal with respect to the major surface of the substrate. A protective dielectric is formed over the first top surface of the gate structure. An exposed sidewall portion of the gate structure is removed in a direction that is substantially horizontal with respect to the major surface of the substrate to define a second top surface of the gate structure, wherein a gate length dimension of the initial gate structure is defined by a distance from a bottom surface of the gate structure to the second top surface of the gate structure.

Embodiments of the invention are directed to semiconductor devices. A non-limiting example semiconductor device includes a channel fin structure formed across from a major surface of a substrate, wherein a top surface of the channel fin structure extends in a direction that is substantially horizontal with respect to the major surface of the substrate. A gate structure is formed across from the major surface of the substrate and along a sidewall surface of the channel fin structure, wherein a first top surface of the gate structure is above the top surface of the channel fin structure and extends in a direction that is substantially horizontal with respect to the major surface of the substrate. A second top surface of the gate structure is defined by a trench formed through an exposed sidewall portion of the gate structure in a direction that is substantially horizontal with respect to the major surface of the substrate, wherein a gate length dimension of the initial gate structure is defined by a distance from a bottom surface of the gate structure to the second top surface of the gate structure.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of VFET, implementation of the teachings recited herein are not limited to a particular type of VFET or IC architecture. Rather embodiments of the present invention are capable of being implemented in conjunction with any other type of VFET or IC architecture, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1:
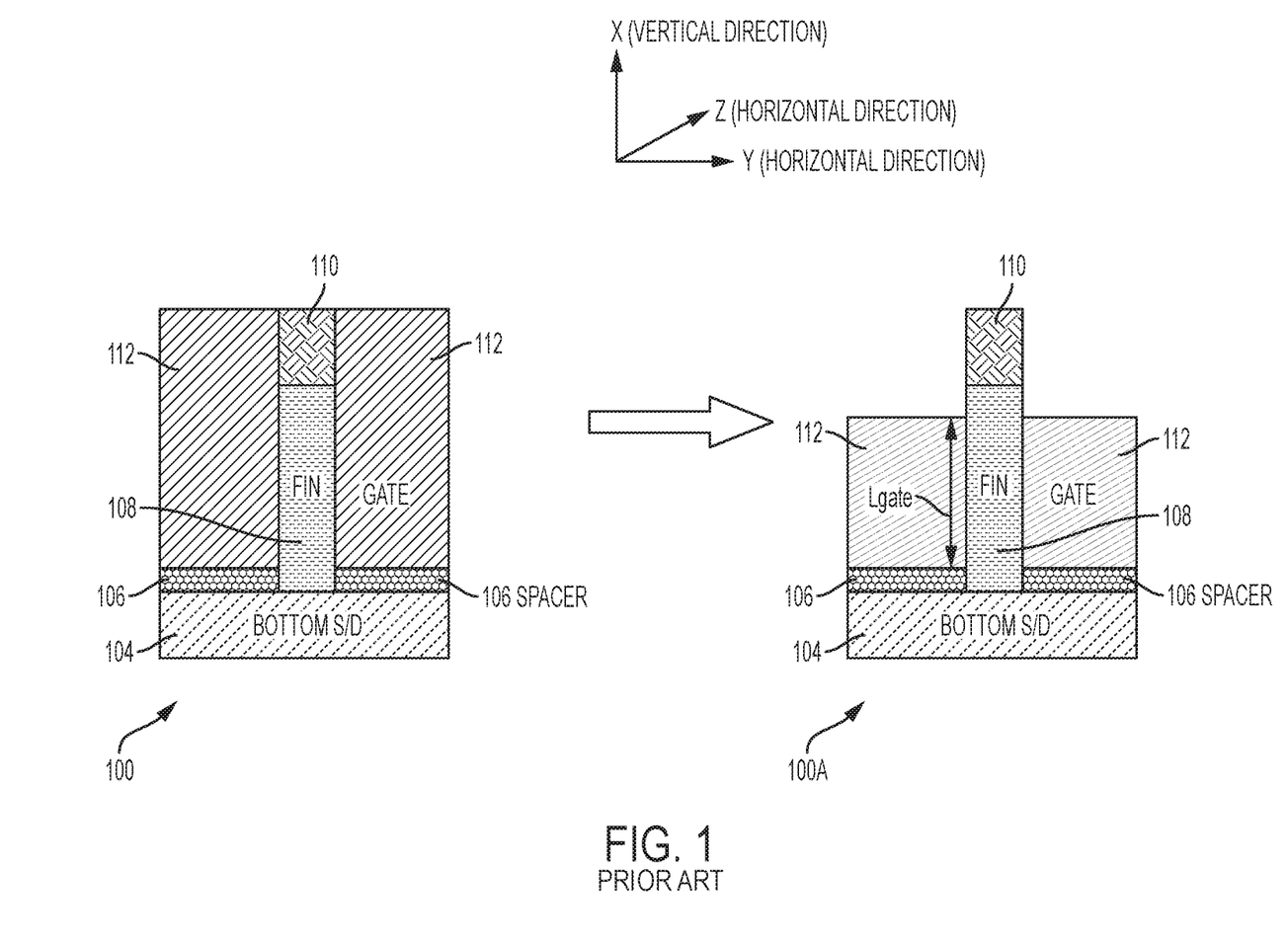
FIG. 1 depicts cross-sectional views of a VFET device after known gate deposition and recess operations.

Turning now to an overview of technologies that are more specifically relevant to aspects of the present invention, as previously noted herein, some non-planar transistor device architectures, such as VFETs, employ semiconductor fins and side-gates that can be contacted outside the active region, resulting in increased device density over lateral devices. FIG. 1 depicts known VFET gate fabrication operations for defining the gate length (Lgate) of a VFET. In FIG. 1, a VFET 100 is shown after known gate deposition and chemical mechanical polishing (CMP) operations have been performed following the formation of a bottom source/drain (S/D) region 104, bottom spacers 106, a fin 108, a hard mask 110, and an initial gate structure 112, configured and arranged as shown. VFET 100A depicts the device after the gate structure 112 has been recess in a vertical direction (as shown by the X/Y/Z diagram) to define Lgate. Because the gate recess relies completely on a vertically directed etch that is a timed etch without endpoint, the timed, vertically directed etch results in variation of the Lgate dimension due to the inherent variations of the timed etch rate, as well as the loading effect. Lgate is a critical transistor parameter, and variations in Lgate can have negative effects (e.g., undesirable variations) on a variety of VFET parameters such as threshold voltage, drive current, leakage current, and the like. Accordingly, there is a need to form VFET semiconductor devices with precisely controlled Lgate dimension.

Turning now to an overview of aspects of the present invention, one or more embodiments of the invention provide methods and structures configured to reduce or eliminate the reliance on vertically directed gate recess operations to recess the initial gate deposition to define Lgate. In embodiments of the invention, a portion of a sidewall surface of the deposited gate is exposed. The Lgate dimension is defined by applying a removal process at the exposed sidewall surface of the gate that proceeds laterally (i.e., horizontally) with respect to a major surface of the device substrate. Because the unexposed portion of the gate sidewall is adjacent the VFET channel fin, Lgate is substantially defined by the height of the channel fin. In some embodiments, the fin is epitaxially grown. Because epitaxy is a precisely controlled, layer-by-layer atomic growth process, the channel fin height is precisely controlled. Because Lgate is substantially defined by a substantially laterally (or horizontally) directed removal process and the height of the channel fin, Lgate is precisely controlled as well. In some embodiments of the invention, the lateral removal process includes a lateral etch that proceeds in a direction that is substantially horizontal with respect to a major surface of the VFET substrate. In some embodiments of the invention, the laterally directed removal process includes an isotropic etch that is primarily laterally directed with a relatively small vertically directed component. In embodiments of the invention that use an isotropic etch, the variation in Lgate introduced by the vertically directed component of the isotropic etch can be maintained within a tolerable range (e.g., about 2.5% percent).

Figure 2:
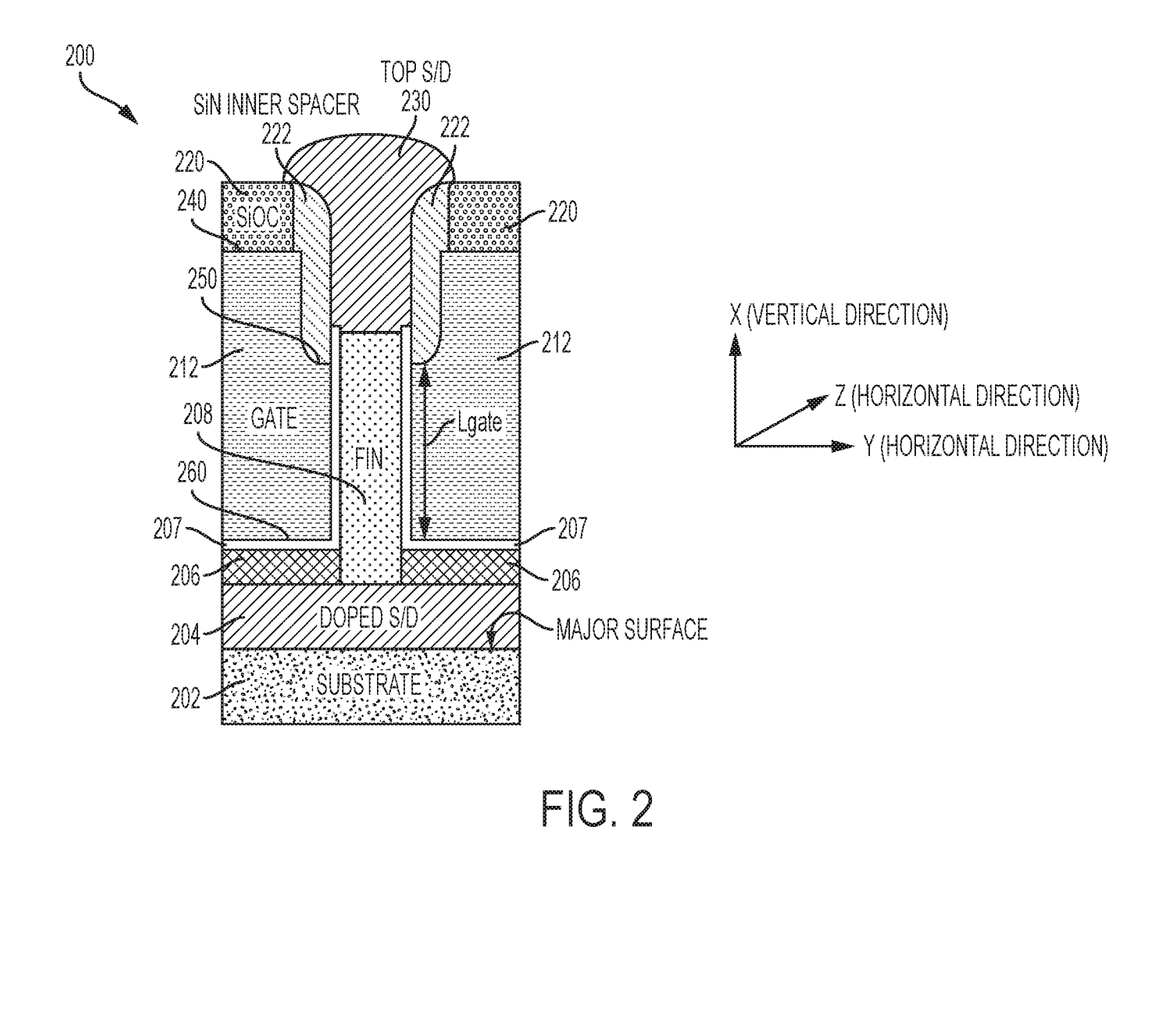
FIG. 2 depicts a cross-sectional view of a VFET semiconductor device according to embodiments of the invention.

Turning now to a more detailed description of aspects of the invention, FIG. 2 depicts a cross-sectional view of a VFET semiconductor device 200 fabricated according to embodiments of the invention. VFET 200 includes a substrate 202, a doped bottom S/D region 204, bottom spacers 206, a gate dielectric 207, a gate region 212, a fin 208, protective dielectric region 220, an inner spacer 222, and a top S/D region 230, configured and arranged as shown. VFET 200 can be fabricated according to the fabrication methodologies illustrated in FIGS. 3-13 and describe in detail subsequently herein. Subsequent fabrication processes (e.g., gate contacts, etc.) are applied to VFET 200 to form a finished semiconductor device. The details of suitable subsequent fabrication processes to form a finished VFET semiconductor device are known to those skilled in the art so have been omitted in the interest of brevity.

Figure 9:
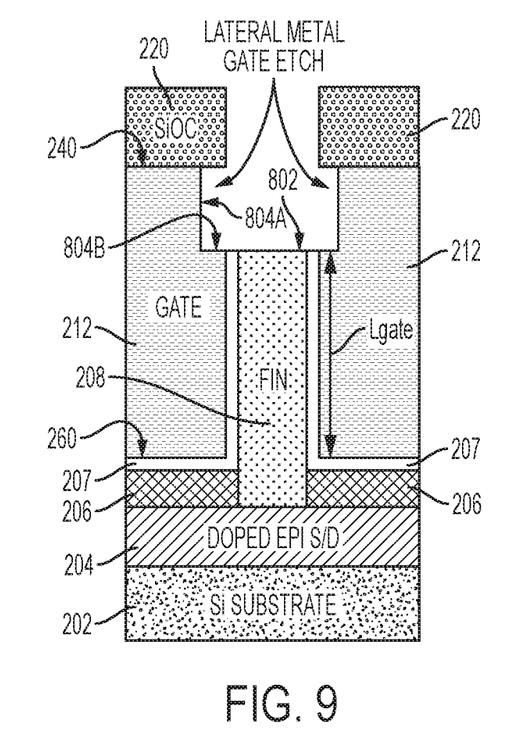
FIG. 9 depicts a cross-sectional view of a semiconductor device after a fabrication operation according to embodiments of the invention.
Figure 10:
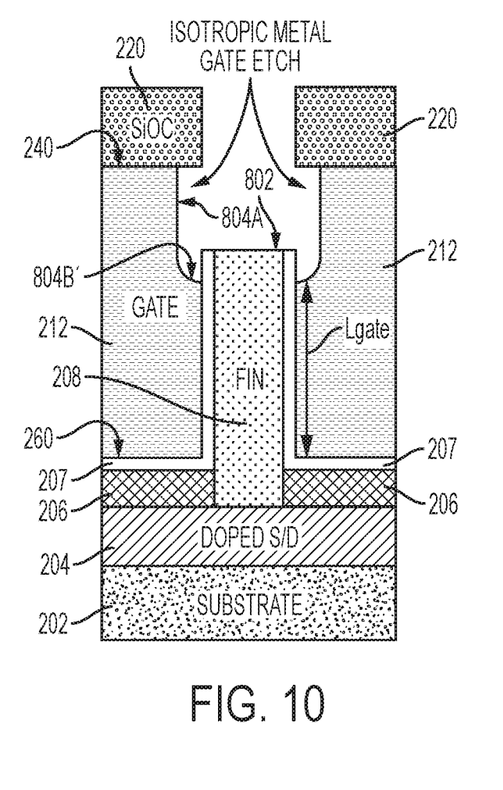
FIG. 10 depicts a cross-sectional view of a semiconductor device after a fabrication operation according to embodiments of the invention.
Figure 11:
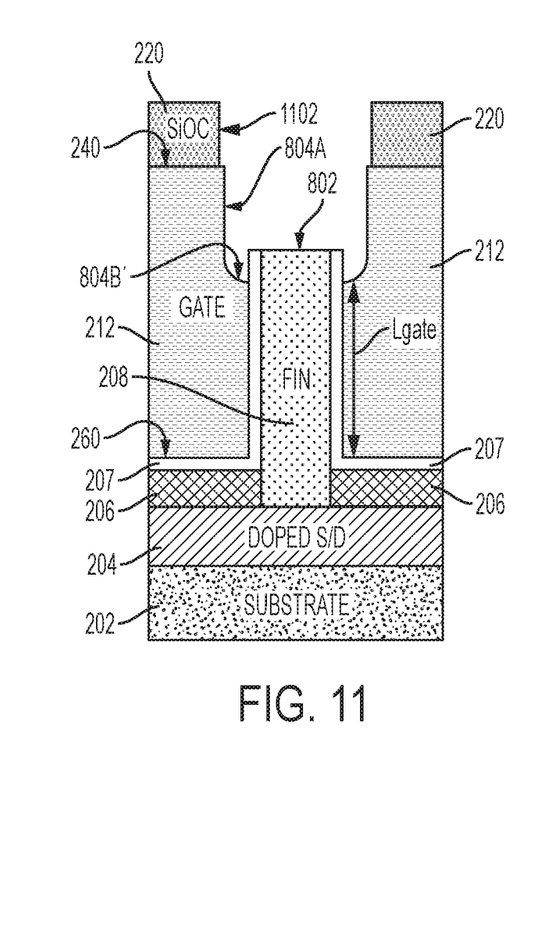
FIG. 11 depicts a cross-sectional view of a semiconductor device after a fabrication operation according to embodiments of the invention.

As shown in FIG. 2, the gate structure 212 includes a novel configuration having a first top surface 240, a second top surface 250, and a bottom surface 260. The Lgate dimension of the gate structure 212 is defined by the distance between the second top surface 250 and the bottom surface 260. The gate structure 212 reduces or eliminates the reliance on vertically directed gate recess operations to recess the initial gate deposition to define Lgate. In gate structure 212, a portion of a sidewall surface of the gate structure (e.g., sidewall 804 shown in FIG. 8) is exposed. The Lgate dimension is defined by applying a removal process at the exposed sidewall surface of the gate structure 212 that proceeds laterally (i.e., horizontally) with respect to a major surface of the substrate 202. Because an unexposed portion of the gate sidewall is adjacent the VFET channel fin 208, Lgate is substantially defined by the height of the channel fin 208. In some embodiments, the channel fin 208 is epitaxially grown. Because epitaxy is a precisely controlled, layer-bylayer atomic growth process, the height of the channel fin 208 is precisely controlled. Because Lgate is substantially defined by a substantially laterally (or horizontally) directed removal process and the height of the channel fin 208, Lgate is precisely controlled as well. In some embodiments of the invention, the lateral removal process includes a lateral etch (e.g., as shown in FIG. 9) that proceeds in a direction that is substantially horizontal with respect to the major surface of the substrate 202. In some embodiments of the invention, the laterally directed removal process includes an isotropic etch (e.g., as shown in FIG. 2, 10 or 11) that is primarily laterally directed with a relatively small vertically directed component.

In embodiments of the invention that use an isotropic etch, the variation in Lgate introduced by the vertically directed component of the isotropic etch can be maintained within a tolerable range (e.g., about 5 percent). For example, in VFET 200, Lgate can be defined by the height of the channel fin 208 minus the vertical component of the isotropic etch minus the thickness of the bottom spacer 206. Accordingly, variations introduced into the Lgate dimension depends on variations in the height of channel fin 208, variations in the vertical component of the isotropic etch, and variations in the thickness of the bottom spacer 206. The variation in the height of the channel fin 208, which can be grown using a precisely controlled blanket epitaxial growth process, is virtually zero and statistically insignificant. The thickness of the bottom spacer 206 is conventionally about 5 nm, and the vertical component of the isotropic etch is conventionally about 5 nm. If a 10 percent variation is assumed for the bottom spacer 206 and the vertical component of the isotropic etch, the total variations introduced by these elements is about 1 nm. The Lgate dimension can be conventionally about 20 nm. Accordingly, the variation in the Lgate dimension according to embodiments of the invention can be approximately 5% (i.e., 1 nm/20 nm), which is within a tolerable range for many VFET applications.

In embodiments of the invention that use a lateral etch, the total variation in the Lgate dimension is introduced by variations in the bottom spacer 206. For example, if the bottom spacer 206 is conventionally about 5 nm, and if a 10 percent variation is assumed for the bottom spacer 206, the total variations introduced by the bottom spacer 206 is about 1 nm. The Lgate dimension can be conventionally about 20 nm. Accordingly, the variation in the Lgate dimension according to embodiments of the invention that use a lateral etch can be approximately 2.5% (i.e., 0.5 nm/20 nm), which is within a tolerable range for many VFET applications.

Figure 3:
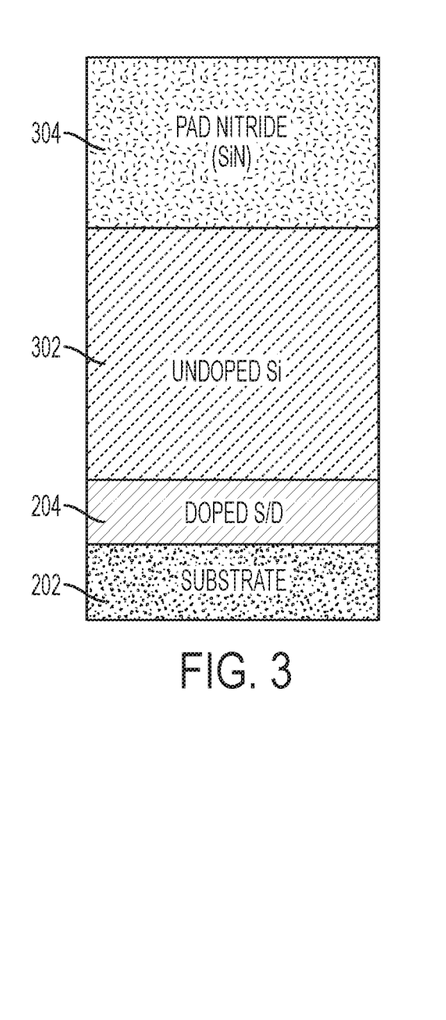
FIG. 3 depicts a cross-sectional view of a semiconductor structure after a fabrication operation according to embodiments of the invention.

FIGS. 3-12 depict cross-sectional views of a semiconductor structure after fabrication operations according to embodiments of the invention. As shown in FIG. 3, a S/D region 204 is formed across from a major surface of a substrate 202. The substrate 202 can be any suitable substrate material, such as, for example, monocrystalline Si, SiGe, SiC, III-V compound semiconductor, II-VI compound semiconductor, or semiconductor-on-insulator (SOI). In some embodiments of the invention, the substrate 202 includes a buried oxide layer (not depicted). In some embodiments of the invention, the S/D region 204 can be formed later in the fabrication process. In some embodiments of the invention, the S/D region 204 is epitaxially grown, and the S/D region doping is provide through in-situ doping during the epitaxial growth process, or through ion implantation after the S/D region 204 is formed. The S/D region 204 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor. The dopant concentration in the source/drain can range from $1 \times 10^{19}$ cm$^{-3}$ to $2 \times 10^{21}$ cm$^{-3}$, or preferably between $2 \times 10^{20}$ cm$^{-3}$ and $1 \times 10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

Continuing with FIG. 3, an undoped semiconductor (e.g., Si) region 302 is formed across from the doped S/D region 204. In some embodiments of the invention, the undoped semiconductor region 302 is epitaxially grown. If needed, dopants can be intentionally added to semiconductor region 302. Typically, if dopants are added to semiconductor region 302, the dopant concentration in semiconductor region 302 is lower than the dopant concentration in the S/D region 204. A pad layer 304 is deposited across from the undoped semiconductor region 302 using any suitable deposition process. For example, the pad layer 304 can be a dielectric such as silicon nitride (SiN), silicon oxide, or a combination of silicon oxide and silicon nitride.

Figure 4:
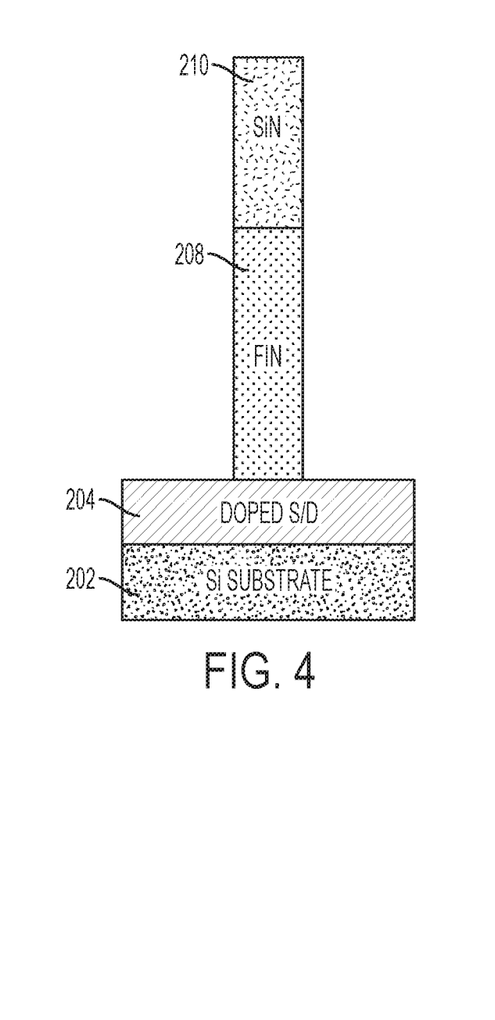
FIG. 4 depicts a cross-sectional view of a semiconductor device after a fabrication operation according to embodiments of the invention.

In FIG. 4, conventional semiconductor device fabrication processes (e.g., patterning and lithography, self-aligned double patterning, self-aligned quadruple patterning) have been used to remove portions of the undoped semiconductor region 302 and the pad nitride 304 to form a channel fin 208 and a hard mask. In some embodiments of the invention, the pad nitride 304 (shown in FIG. 3) is patterned to expose portions of the undoped semiconductor region 302. The exposed portions of the semiconductor region 302 can then be removed or recessed to form the channel fin 208 a wet etch, a dry etch, or a combination thereof. The channel fin 208 can be electrically isolated from other regions of the substrate 202 by a shallow trench isolation (not depicted). The shallow trench isolation can be of any suitable dielectric material, such as, for example, a silicon oxide.

Figure 5:
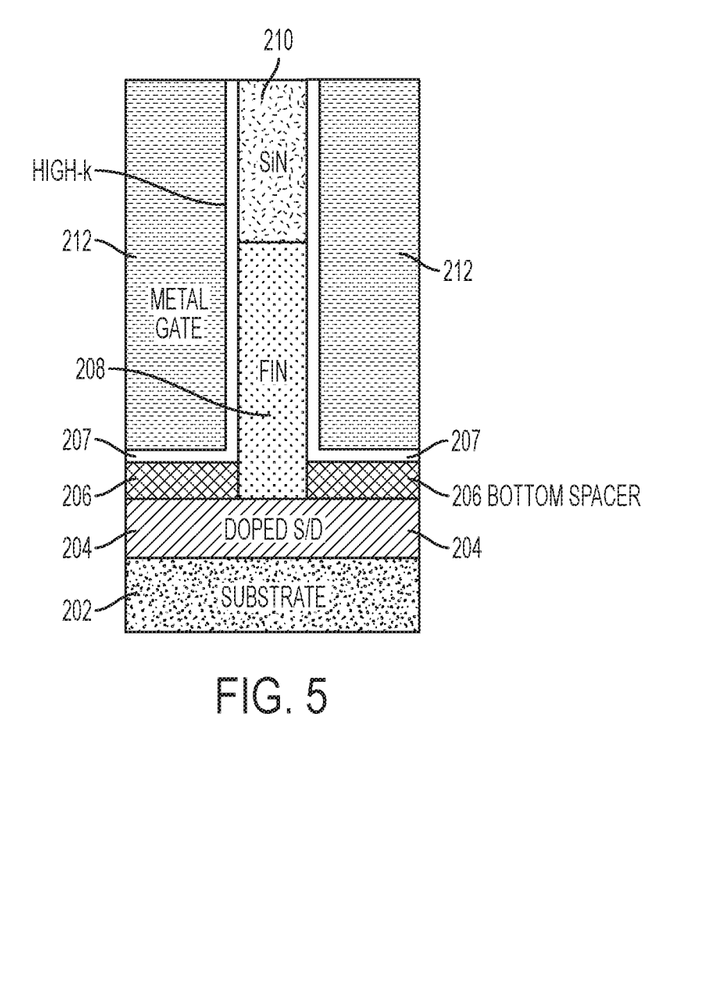
FIG. 5 depicts a cross-sectional view of a semiconductor device after a fabrication operation according to embodiments of the invention.

In FIG. 5, bottom spacers 206 are formed across from the doped S/D region 204 and adjacent to a bottom portion of the channel fin 208. The bottom spacers 206 can include a dielectric material, such as, for example, SiN, SiC, SiOC, SiCN, BN, SiBN, SiBCN, SiOCN, $SiO_xN_y$, and combinations thereof. The dielectric material can be a low-k material having a dielectric constant less than about 7, less than about 5, or even less than about 2.5. The bottom spacers 208 can be formed using known deposition processes, such as, for example, CVD, PECVD, ALD, PVD, chemical solution deposition, or other like processes.

In FIG. 5, a gate structure that includes a gate conductor 212 (e.g., a work function metal (WFM)) and one or more gate dielectric films 207 is deposited over the bottom spacer 206 and adjacent to the channel fin 208 and the hard mask 210. In some embodiments of the invention, the gate conductor 212 is overfilled above a top surface of the hard mask 210 and planarized to substantially the same level as the top surface of the hard mask 210 using, for example, CMP.

The one or more gate dielectric films 207 can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films 207 can further include dopants such as, for example, lanthanum and aluminum. The gate dielectric films 207 can be formed by suitable deposition processes, for example, CVD, PECVD, atomic layer deposition (ALD), evaporation, physical vapor deposition (PVD), chemical solution deposition, or other like processes. The thickness of the gate dielectric films 207 can vary depending on the deposition process as well as the composition and number of high-k dielectric materials used.

The gate 212 (or gate "conductor") can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments of the invention, the gate 212 can be a WFM deposited over the gate dielectric films 207 by a suitable deposition process, for example, CVD, PECVD, PVD, plating, thermal or e-beam evaporation, and sputtering. The type of WFM depends on the type of transistor and can differ between the nFET and pFET devices. P-type WFMs include compositions such as ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The gate 212 can further include a tungsten (W), titanium (Ti), aluminum (Al), cobalt (Co), or nickel (Ni) material over the WFM layer of the gate 212. The gate 212 can be deposited by a suitable deposition process, for example, CVD, PECVD, PVD, plating, thermal or e-beam evaporation, and sputtering.

Figure 6:
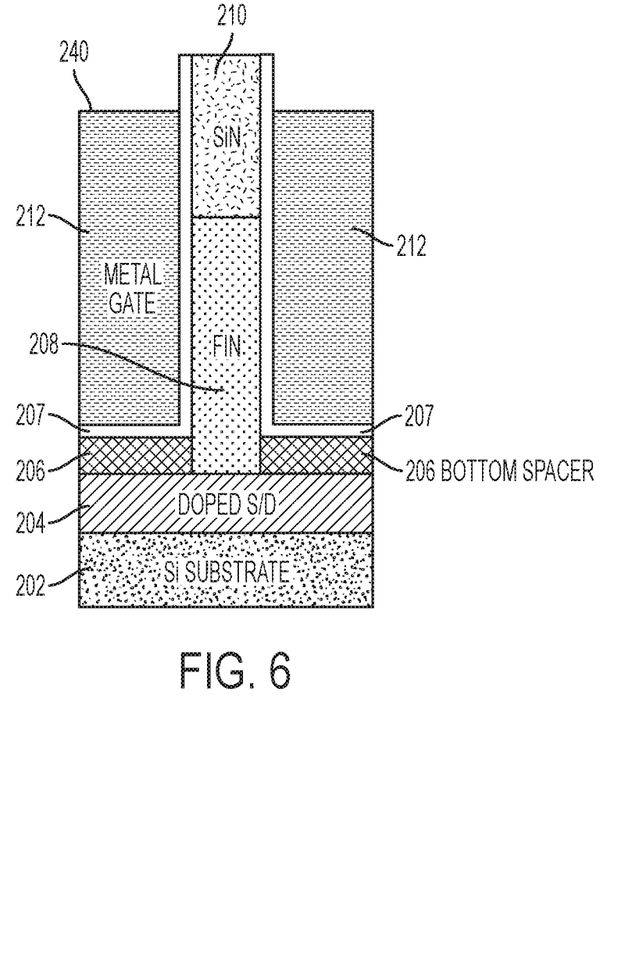
FIG. 6 depicts a cross-sectional view of a semiconductor device after a fabrication operation according to embodiments of the invention.

In FIG. 6, the gate 212 is recessed in a substantially vertical direction below a top surface of the hard mask 210 but above a top surface of the channel fine 208. According to embodiments of the invention, the vertically directed recess of the gate 212 does not need to be precisely controlled. The post-recess top surface of the gate 212 according to embodiments of the invention only needs to stop somewhere along a sidewall of the hard mask 210 and above a top surface of the channel fin 208. The gate 212 can be recessed using any suitable process, such as, for example, a wet etch, a dry etch, or a combination thereof.

Figure 7:
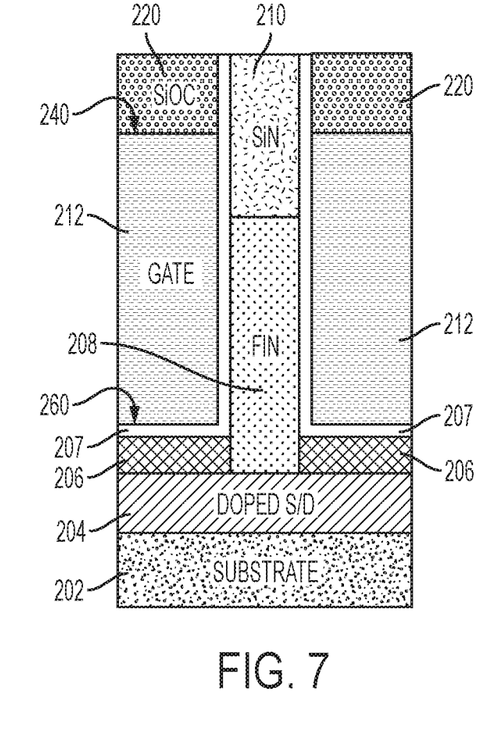
FIG. 7 depicts a cross-sectional view of a semiconductor device after a fabrication operation according to embodiments of the invention.

In FIG. 7, protective region 220 is formed over a top surface of the gate 212. In some embodiments of the invention, the protective region 220 is a dielectric (e.g., SiOC). The protective region 220 can be formed by suitable deposition processes, for example, CVD, PECVD, atomic layer deposition (ALD), evaporation, physical vapor deposition (PVD), chemical solution deposition, or other like processes. The thickness of the protective region 220 can vary depending on the deposition process as well as the specific requirements of the application. In some embodiments of the invention, the protective region 220 is overfilled above a top surface of the hard mask 210 and planarized to substantially the same level as the top surface of the hard mask 210 using, for example, CMP.

Figure 8:
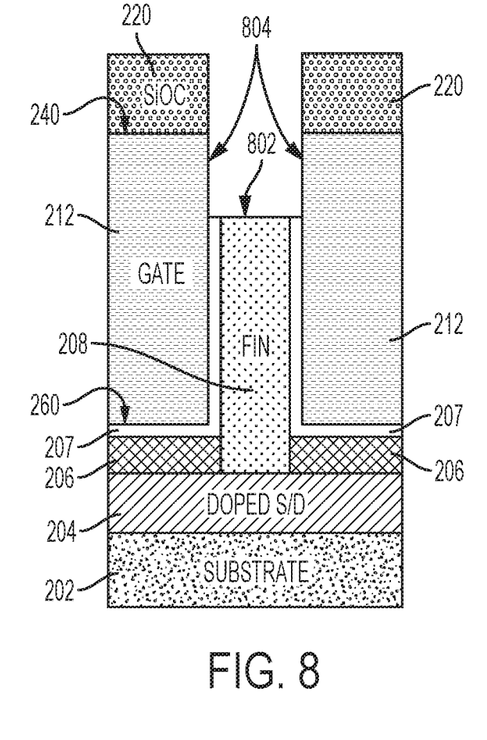
FIG. 8 depicts a cross-sectional view of a semiconductor device after a fabrication operation according to embodiments of the invention.

In FIG. 8, the hard mask 210 has been removed. The hard mask 210 can be removed using known hard mask open processes, such as, for example, a wet etch, a dry etch, or a combination thereof. After removal of the hard mask 210, sidewall surfaces of 804 of the gate 212 are exposed, along with a top surface 802 of the channel fin 208.

In FIG. 9, in accordance with embodiments of the invention, a portion of the gate 212 is removed to define a recessed sidewall surface 804A and a second top surface 804B of the gate 212. The Lgate dimension of the gate structure 212 is defined by the distance between the second top surface 804B and a bottom surface 260 of the gate 212. Thus, the gate structure 212 depicted in FIG. 9 reduces or eliminates the reliance on vertically directed gate recess operations to recess the initial gate deposition to define Lgate. In embodiments of the invention, the portion of the gate 212 is removed by applying a removal process at the exposed sidewall surface 804A of the gate structure 212 that proceeds laterally (i.e., horizontally) with respect to the major surface (shown in FIG. 2) of the substrate 202. Because an unexposed portion of the gate sidewall is adjacent the channel fin 208, the Lgate dimension is substantially defined by the height of the channel fin 208. In some embodiments of the invention, the channel fin 208 is epitaxially grown. Because epitaxy is a precisely controlled, layer-by-layer atomic growth process, the height of the channel fin 208 is precisely controlled. Because Lgate is substantially defined by a substantially laterally (or horizontally) directed removal process and the height of the channel fin 208, Lgate is precisely controlled as well. In some embodiments of the invention, the lateral removal process includes a lateral etch that proceeds in a direction that is substantially horizontal with respect to the major surface of the substrate 202.

FIG. 10 depicts a fabrication stage that corresponds to the fabrication stage shown in FIG. 9 except the laterally directed removal process includes an isotropic etch that is primarily laterally directed with a relatively small vertically directed component. At the start, the isotropic etch proceeds only in a lateral direction in the same manner as the lateral etch. As the isotropic etch proceeds, a second top surface 804B' is formed in the gate 212, and, because the etch is isotropic (i.e., proceeds in all directions), the etch proceeds to move into the second top surface 804B'. However, because only a relatively small amount of the exposed sidewall surface 804 (shown in FIG. 8) needs to be removed, the total depth of the top surface 804B' below the top channel fin surface 802 is a relatively small percentage of the Lgate dimension.

For example, in some embodiments of the invention, the variation in the Lgate dimension that is introduced by the vertically directed component of the isotropic etch can be maintained within a tolerable range (e.g., about 5 percent). For example, the Lgate dimension shown in FIG. 10 can be defined by the height of the channel fin 208 minus the vertical component of the isotropic etch minus the thickness of the bottom spacer 206. Accordingly, variations introduced into the Lgate dimension depends on variations in the height of channel fin 208, variations in the vertical component of the isotropic etch, and variations in the thickness of the bottom spacer 206. The variation in the height of the channel fin 208, which can be grown using a precisely controlled blanket epitaxial growth process, is virtually zero and statistically insignificant. The thickness of the bottom spacer 206 is conventionally about 5 nm, and the vertical component of the isotropic etch is conventionally about 5 nm. If a 10 percent variation is assumed for the bottom spacer 206 and the vertical component of the isotropic etch, the total variations introduced by these elements is about 1 nm. The Lgate dimension can be conventionally about 20 nm. Accordingly, the variation in the Lgate dimension, according to embodiments of the invention that apply an isotropic etch to the exposed sidewall surface 804 (shown in FIG. 8), can be approximately 5% (i.e., 1 nm/20 nm), which is within a tolerable range for many VFET applications.

In embodiments of the invention that use a lateral etch shown in FIG. 9, the total variation in the Lgate dimension is introduced by variations in the bottom spacer 206. For example, if the bottom spacer 206 is conventionally about 5 nm, and if a 10 percent variation is assumed for the bottom spacer 206, the total variations introduced by the bottom spacer 206 is about 1 nm. The Lgate dimension can be conventionally about 20 nm. Accordingly, the variation in the Lgate dimension, according to embodiments of the invention that apply a lateral etch to the exposed sidewall surface 804 (shown in FIG. 8), can be approximately 2.5% (i.e., 0.5 nm/20 nm), which is within a tolerable range for many VFET applications.

In FIG. 11, a sidewall portion 1102 of the protective region 220 can be removed to more closely align the sidewall portion 1102 of the protective region 220 with the exposed sidewall portion 804A of the gate 212. There is no need to precisely control the etch back of the protective region 220 as long as the edge of the protective region 220 is beyond the edge of the gate 212. The sidewall portion 1102 of protective region 220 can be removed by suitable removal process, including for example, isotropic etching, lateral etching, or other like processes.

Figure 12:
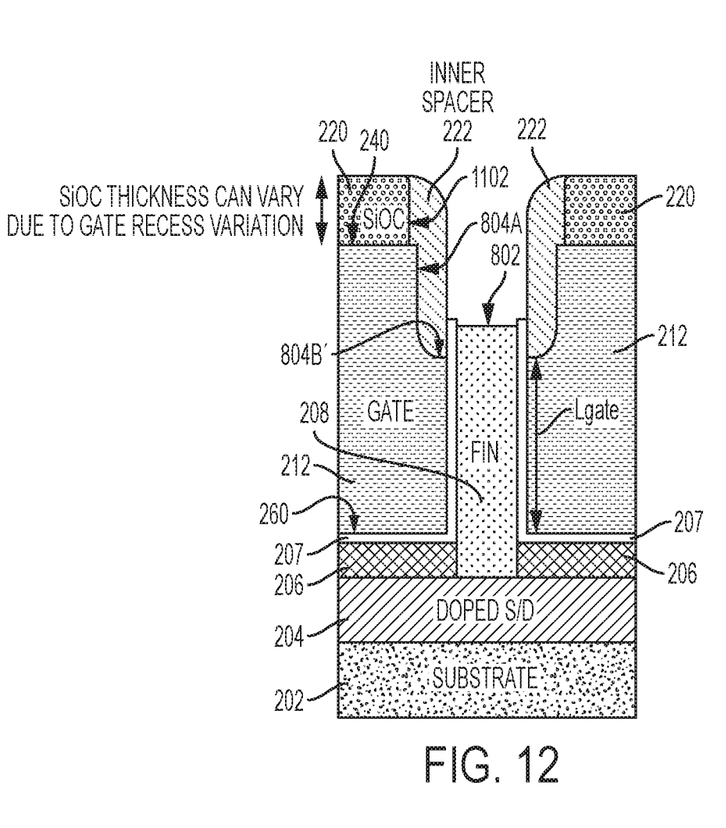
FIG. 12 depicts a cross-sectional view of a semiconductor device after a fabrication operation according to embodiments of the invention.

In FIG. 12, the inner spacers 222 are formed along the sidewall portion 1102 of the protective region 220, a portion of the first top surface 240 of the gate 212, the sidewall portion 804A of the gate metal, and the second top surface 804B' of the gate 212. The inner spacers 222 can be formed by any suitable fabrication process, including for example a deposition followed by a directional etch (e.g., a wet or dry RIE) to expose the top surface 802 of the channel fin 208.

The top S/D region 230 (shown in FIG. 2) is formed over the top surface 802 of the channel fin 208 between the inner spacers 222, resulting in the final VFET semiconductor device 200 shown in FIG. 2. The protective regions 220 and the inner spacers 222 substantially isolate the gate 212 from the top S/D region 230. In some embodiments of the invention, the top S/D region 230 is epitaxially grown, and S/D region doping can be provided through in-situ doping during the epitaxial growth process, or through ion implantation after the top S/D region 230 is formed.

Figure 13:
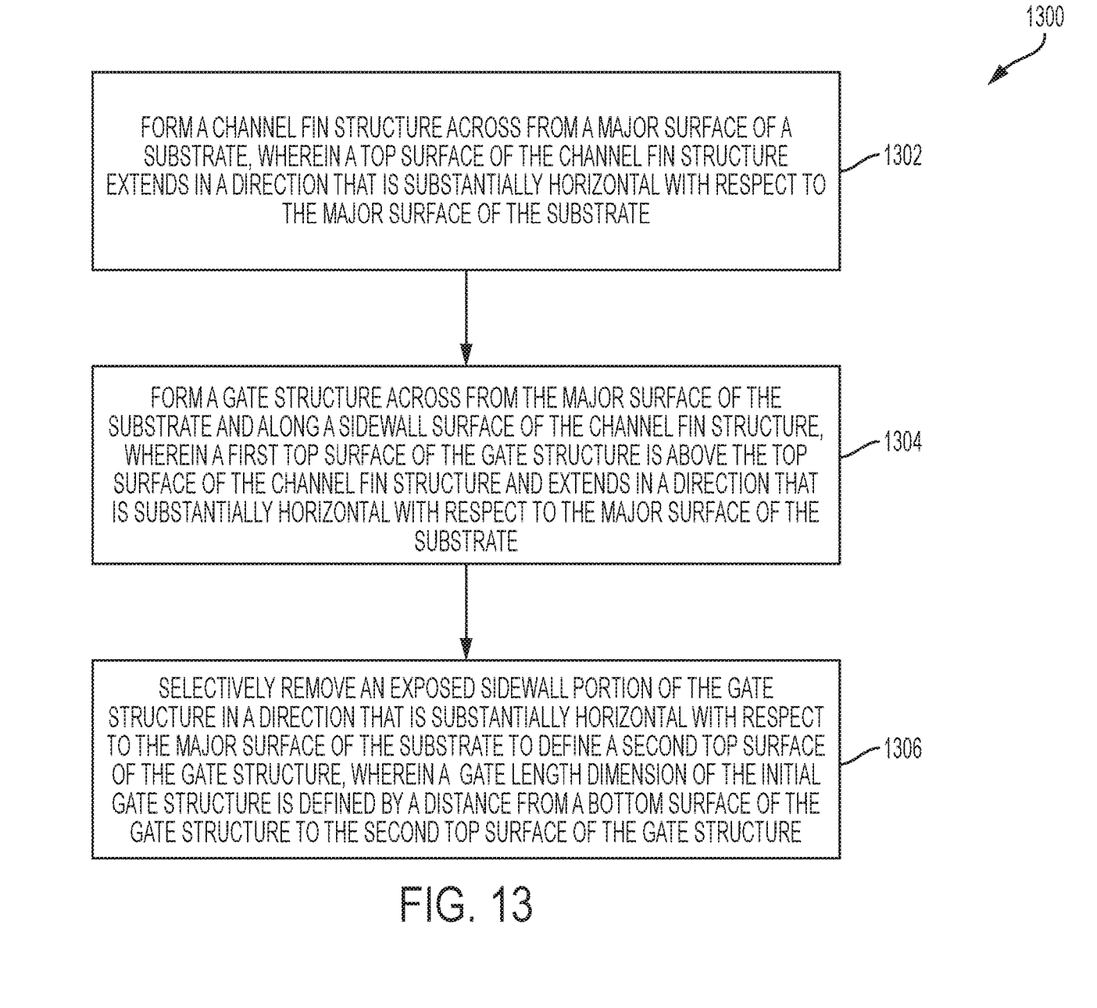
FIG. 13 depicts a flow diagram illustrating a fabrication methodology according to embodiments of the invention.

FIG. 13 depicts a flow diagram illustrating a fabrication methodology 1300 according to one or more embodiments. The fabrication methodology 1300 includes a block 1302 forming a channel fin structure across from a major surface of a substrate, wherein a top surface of the channel fin structure extends in a direction that is substantially horizontal with respect to the major surface of the substrate. In block 1304, a gate structure is formed across from the major surface of the substrate and along a sidewall surface of the channel fin structure, wherein a first top surface of the gate structure is above the top surface of the channel fin structure and extends in a direction that is substantially horizontal with respect to the major surface of the substrate. In block 1306, an exposed sidewall portion of the gate structure is selectively removed in a direction that is substantially horizontal with respect to the major surface of the substrate to define a second top surface of the gate structure, wherein a gate length dimension of the initial gate structure is defined by a distance from a bottom surface of the gate structure to the second top surface of the gate structure.

In some embodiments of the invention, an inner spacer is formed above the second top surface of the gate structure, and a top source or drain region is formed above the top surface of the channel fin structure, wherein the inner spacer substantially isolates the top source or drain region from the gate structure, wherein forming the channel fin includes applying an epitaxial growth process, wherein selectively removing the exposed sidewall portion of the gate structure includes applying a directional etch to the exposed sidewall portion of the gate structure. In some embodiment of the invention, selectively removing the exposed sidewall portion of the gate further includes selectively removing the exposed sidewall portion of the gate structure in a direction that is substantially vertical with respect to the major surface of the substrate to further define the second top surface of the gate structure.

In some embodiments of the invention, an isotropic etch process is used to substantially remove the exposed sidewall portion of the gate structure in the direction that is substantially horizontal with respect to the major surface of the substrate. In some embodiments of the invention the isotropic etch is further used to substantially remove the exposed sidewall portion of the gate structure in the direction that is substantially vertical with respect to the major surface of the substrate.

In some embodiments of the invention, a bottom source or drain region is formed below the channel fin structure, and a bottom spacer is formed between the bottom source or drain region and bottom surface of the gate structure.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a {100} orientated crystalline surface can take on a {100} orientation. In some embodiments of the invention, epitaxial growth and/or deposition processes can be selective to forming on semiconductor surface, and cannot deposit material on exposed surfaces, such as silicon dioxide or silicon nitride surfaces.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A semiconductor device comprising:
a channel fin structure comprising a fin-shaped structure formed across from a major surface of a substrate, wherein a top surface of the channel fin structure is substantially parallel with respect to the major surface of the substrate, wherein the channel fin structure comprises sidewalls;
a gate conductor formed across from the major surface of the substrate and along the sidewalls of the channel fin structure, wherein a first top surface of the gate conductor is above the top surface of the channel fin structure and substantially parallel with respect to the major surface of the substrate;
wherein the gate conductor comprises an outer gate conductor sidewall and an inner gate conductor sidewall;
a second top surface of the gate conductor that is substantially parallel with respect to the major surface of the substrate, wherein the second top surface and the inner gate conductor sidewall define a trench formed through an exposed sidewall portion of the gate conductor;

a spacer formed in the trench; and a top source or drain (S/D) formed on the top surface of the channel fin structure, wherein a top surface of the top S/D is above the first top surface of the gate conductor;

wherein the inner gate conductor sidewall is positioned closer in a horizontal direction to the top S/D than the outer gate conductor sidewall;

wherein a gate length dimension of the gate conductor is defined by a distance from a bottom surface of the gate conductor to the second top surface of the gate conductor.

* * * * *